United States Patent
Chung

(10) Patent No.: US 6,580,031 B2
(45) Date of Patent: Jun. 17, 2003

(54) METHOD FOR MAKING A FLEXIBLE CIRCUIT INTERPOSER HAVING HIGH-ASPECT RATIO CONDUCTORS

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 0 days.

(21) Appl. No.: 09/727,307

(22) Filed: Nov. 30, 2000

(65) Prior Publication Data

US 2002/0046873 A1 Apr. 25, 2002

Related U.S. Application Data

(63) Continuation-in-part of application No. 09/524,148, filed on Mar. 14, 2000, now Pat. No. 6,376,769, and a continuation-in-part of application No. 09/578,583, filed on May 25, 2000.

(60) Provisional application No. 60/190,607, filed on Mar. 20, 2000, provisional application No. 60/194,434, filed on Apr. 4, 2000, and provisional application No. 60/220,909, filed on Jul. 26, 2000.

(51) Int. Cl.[7] ................................................. H05K 3/00
(52) U.S. Cl. .......................... 174/52.2; 29/829; 29/835; 29/842
(58) Field of Search .............................. 174/52.2, 52.3, 174/52.4, 255, 259, 260; 361/749, 750; 29/829, 833, 835, 841, 842, 848, 844, 846

(56) References Cited

U.S. PATENT DOCUMENTS

| | | |
|---|---|---|
| 3,555,364 A | 1/1971 | Matcovich |
| 4,734,825 A | 3/1988 | Peterson |
| 5,043,794 A | 8/1991 | Tai et al. |

(List continued on next page.)

FOREIGN PATENT DOCUMENTS

| | | |
|---|---|---|
| WO | WO 98/26476 | 6/1998 |
| WO | WO 98/44564 | 10/1998 |

OTHER PUBLICATIONS

International Search Report, May 21, 2001, 4 Pages.
Co Van Veen, "IC Packaging And Assembly Issues For Next Generation Miniaturised Consumer Electrons", Future Fab International, pp. 379–382 (4 Pages).
Jack Fisher, "Advancements in Multilayer Material Technology", Future Circuits International, 4 Pages.
Petri Savolainen, "Area Array Packages And High–Density Printed Wiring Boards", Future Circuits International, pp. 193–195 (3 Pages).
Patrick Thompson, "Chip–scale Packaging", IEEE Spectrum, Aug. 1997, pp. 36–43 (8 Pages).
Dennis Herrell, "Power to the Package", IEEE Spectrum, Jul. 1999, pp. 46–53 (8 Pages).
Vern Solberg,"Chip–Scale Array Devices", Future Circuits International, 5–Pages.

(List continued on next page.)

Primary Examiner—Dean A. Reichard
Assistant Examiner—Carmelo Oliva
(74) Attorney, Agent, or Firm—Dann, Dorfman, Herrell & Skillman P.C.

(57) ABSTRACT

A low-modulus-of-elasticity flexible adhesive interposer substrate has high aspect ratio via conductors to which an electronic device, such as a semiconductor chip or die or other component, is attached, e.g., for a high density electronic package. A method for making the flexible adhesive interposer substrate includes etching a sheet of metal to form the high aspect ratio via conductors which are held in position by a sheet or layer of a molecularly flexible adhesive. The via conductors may be built up to even greater aspect ratio. Such flexible interposer may include high aspect ratio via conductors for a plurality of similar or different electronic devices.

52 Claims, 6 Drawing Sheets

U.S. PATENT DOCUMENTS

| | | |
|---|---|---|
| 5,048,166 A | 9/1991 | Wakamatsu |
| 5,148,265 A | 9/1992 | Khandros et al. |
| 5,172,303 A | 12/1992 | Bernardoni et al. |
| 5,192,716 A | 3/1993 | Jacobs |
| 5,286,926 A | 2/1994 | Kimura et al. |
| 5,347,159 A | 9/1994 | Khandros et al. |
| 5,367,764 A | 11/1994 | DiStefano et al. |
| 5,371,654 A | 12/1994 | Beaman et al. |
| 5,375,041 A | 12/1994 | McMahon |
| 5,386,341 A | 1/1995 | Olson et al. |
| 5,394,303 A | 2/1995 | Yamaji |
| 5,473,119 A | 12/1995 | Rosenmayer et al. |
| 5,483,421 A | 1/1996 | Gedney et al. |
| 5,548,091 A | 8/1996 | DiStefano et al. |
| 5,558,928 A | 9/1996 | DiStefano et al. |
| 5,570,504 A | 11/1996 | DiStefano et al. |
| 5,583,321 A | 12/1996 | DiStefano et al. |
| 5,672,548 A | 9/1997 | Culnane et al. |
| 5,682,061 A | 10/1997 | Khandros et al. |
| 5,685,885 A | 11/1997 | Khandros et al. |
| 5,686,699 A | 11/1997 | Chu et al. |
| 5,734,555 A | 3/1998 | McMahon |
| 5,777,379 A | 7/1998 | Karavakis et al. |
| 5,783,870 A | 7/1998 | Mostafazadeh et al. |
| 5,794,330 A | 8/1998 | DiStefano et al. |
| 5,798,564 A | 8/1998 | Eng et al. |
| 5,801,439 A | 9/1998 | Fujisawa et al. |
| 5,848,467 A | 12/1998 | Khandros et al. |
| 5,861,666 A | 1/1999 | Bellaar |
| 5,875,545 A | 3/1999 | DiStefano et al. |
| 5,901,041 A | 5/1999 | Davies et al. |
| 5,915,170 A | 6/1999 | Raab et al. |
| 5,926,369 A | 7/1999 | Ingraham et al. |
| 5,929,517 A | 7/1999 | DiStefano et al. |
| 5,943,213 A | 8/1999 | Sasov |
| 5,950,304 A | 9/1999 | Khandros et al. |
| 6,247,229 B1 * | 6/2001 | Glenn ................ 174/52.2 |
| 6,376,769 B1 * | 4/2002 | Chung ................ 174/260 |
| 2002/0027010 A1 * | 3/2002 | Glenn ................ 174/52.2 |

OTHER PUBLICATIONS

Joan Tourne, "The Future Of Non–Woven Laminates", Future Circuits International, pp. 129–131 (3 Pages).

Walter Olbrich, "High Density Printed Circuit Board Technologies", Future Circuits International, pp. 133–138 (6 Pages).

Ivan Ho, "Microvia Technology", Future Circuits International, pp. 139–141 (3 Pages).

Dieter Bergman, "BGAs The Component Package Of Choice", Future Circuits International, 7 Pages.

Mark Hutton, "High Density Substrates for IC Packaging", Future Circuits International, 3 Pages.

Ravi M. Bhatkal, "Techno–Economic Analysis of Alternative Wafer Bumping Technologies", Future Circuits International, 4 Pages.

"International Search Report", PCT/US00/13077, Aug. 18, 2000 (2 Pages).

* cited by examiner

METHOD FOR MAKING A FLEXIBLE CIRCUIT INTERPOSER HAVING HIGH-ASPECT RATIO CONDUCTORS

This Application is a continuation-in-part of U.S. patent application Ser. No. 09/524,148 filed Mar. 14, 2000 now U.S. Pat. No. 6,376,769 and of U.S. patent application Ser. No. 09/578,583 filed May 25, 2000, and claims the benefit of U.S. Provisional Application Ser. No. 60/190,607 filed Mar. 20, 2000, of U.S. Provisional Application Ser. No. 60/194,434 filed Apr. 4, 2000, and of U.S. Provisional Application Ser. No. 60/220,909 filed Jul. 26, 2000.

The present invention relates to a method and flexible circuit interposer and, in particular, to a method and flexible circuit interposer having high-aspect ratio conductors therethrough.

As semiconductor integrated circuit technology has advanced to greatly increase the amount and operating speed of the circuitry that can be fabricated on a single semiconductor chip, it has become more difficult to effectively utilize such integrated circuits due to the greatly increased number of input and output connections to the chip and the decreasing spacing or pitch of those connections. The connection problem has become more severe where the number of connections exceeds that conveniently or economically attainable in a conventional mechanical package.

One approach to solve this problem utilizes semiconductor chips mounted with contacts against and connecting to corresponding contacts on the next-level circuit board, the so-called "flip-chip" mounting. This flip-chip technique requires that the contacts on the next-level circuit board be of substantially the same size and of the same pitch as are those on the semiconductor chip, however, the pitch of the semiconductor chip connections has become much finer than the pitch attainable on conventional substrates and printed wiring circuit boards to which such semiconductor chips are mounted. In addition, the differences in thermal expansion between the semiconductor chip and the next-level circuit board caused by differences in the coefficient of thermal expansion (CTE) of the materials produces thermally-induced stress that can lead to failure and/or degradation of the interconnections when exposed to temperature extremes, such as in thermal cycling or soldering.

A further solution to these problems has employed an intermediate substrate between the semiconductor chip and the next-level circuit board to absorb some of the thermally-induced stress, and also to allow the fanning out of the connections to the semiconductor chip to permit a larger contact size and pitch that is compatible with conventional printed wiring circuit board technology. If the intermediate substrate is substantially larger than the size of the semiconductor chip, then the advantage of small chip size is lost, as is the advantage of short electrical lead length that improves the ability to operate the circuit at very high operating frequencies. While this has been addressed by reducing the size of the intermediate substrate and employing next-level substrate technologies capable of finer line widths and smaller features, the rigidity of the intermediate substrate has again posed some difficulties.

The difficulties of rigid intermediate substrates have been addressed by making the substrates of specialized materials that are referred to as being "flexible," such as very thin polyimide and other so-called "flexible" conventional substrates on which printed wiring conductors and plated through holes can be formed by conventional methods. But, such substrate materials are not truly flexible in that they do not have a low modulus of elasticity, but only flex to a greater extent because they have been made of much thinner material having a high modulus of elasticity. Conventional materials, such as polyimide sheet, have a high modulus of elasticity, e.g., a modulus greater than 70,000 kg/cm$^2$ (1,000,000 psi). In addition, the use of such materials and conventional fabrication methods results in an increased cost that is undesirable and may require assembly processes that are more difficult or expensive to perform.

Although certain intermediate substrates have been devised to avoid some of these difficulties, these substrates tend to be most beneficial when they are relatively thin. The thickness of the dielectric layer thereof and the length of the conductors passing through the dielectric layer is relatively short, e.g., on the order of the diameter thereof or less. If through conductors or vias having higher aspect ratios, i.e. higher ratios of their length to their diameter were available, then thicker intermediate substrates could be employed and could, for example, ease the buildup of undesirable thermal stress.

It would also be desirable if an interposer were to be suitable for a high-density (e.g., chip-scale) package, and yet avoid some of the technical disadvantage of conventional intermediate substrates. It would be further desirable if such interposer were to be attachable to the electronic device and next-level circuit substrate at a temperature that is much closer to room temperature, rather than at the much higher temperature needed to melt solder (e.g., 200–250° C.) or to melt-flow high-temperature electrically-conductive thermoplastic adhesives (e.g., 100–150° C.), to also ease the buildup of undesirable thermal stress. Such interposer might then be suitable for attachment to a semiconductor wafer separable into a plurality of electronic die and could be excised with the individual semiconductor die from the wafer.

Accordingly, there is a need for an intermediate circuit substrate or interposer that has higher aspect ratio via conductors and for a suitable method for making such interposer.

To this end, the method of the present invention comprises:

providing a sheet of metal;

removing part of the sheet of metal to leave a plurality of columnar conductors having distal ends projecting from a remaining web of the sheet of metal;

applying a layer of dielectric adhesive on the remaining web and surrounding the columnar conductors except for the distal ends thereof;

removing at least part of the remaining web to electrically isolate ones of the columnar conductors from others of the columnar conductors.

An electronic device according to the invention comprises an interposer having a layer of dielectric adhesive and a plurality of columnar conductors therethrough, wherein the columnar conductors include at least a section that is solid metal and have an aspect ratio of at least 1.5, an electronic component having contacts thereon, and connections of the contacts of the electronic component to respective first ends of ones of the columnar conductors of the interposer.

BRIEF DESCRIPTION OF THE DRAWING

The detailed description of the preferred embodiments of the present invention will be more easily and better understood when read in conjunction with the FIGURES of the Drawing which include.

Figure 1:
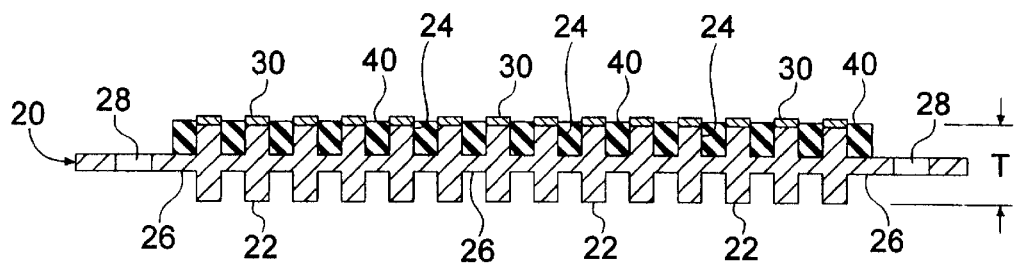
FIG. 1 is a cross-sectional schematic diagram illustrating a step in the making of a an exemplary high aspect ratio interposer according to the invention.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. Similarly, similar elements or features may be designated by like alphanumeric designations in different figures of the Drawing and with similar nomenclature in the specification, but in the Drawing are preceded by digits unique to the embodiment described. For example, a particular element may be designated as "xx" in one figure, by "1xx" in another figure, by "2xx" in another figure, and so on. It is noted that, according to common practice, the various features of the drawing are not to scale, and the dimensions of the various features are arbitrarily expanded or reduced for clarity.

DESCRIPTION OF THE PREFERRED EMBODIMENTS

The present invention relates to an intermediate substrate or interposer of the sort usable in joining one electronic device to another, for example, for joining an electronic device such as a circuit on a semiconductor die to a circuit substrate such as a thin film or thick film ceramic substrate or a printed wiring circuit board, often referred to as a next-level circuit substrate. In particular, the interposers of the present invention have high aspect ratio via conductors providing electrical connections between respective corresponding contacts on the respective electronic devices, e.g., on the semiconductor die and on the circuit substrate. As used herein, "aspect ratio" means the ratio of the length of a via conductor to its diameter, if cylindrical, or to its width, if non-cylindrical, and a "high aspect ratio" is an aspect ratio that is greater than unity. Interposers or intermediate substrates having high aspect ratio via conductors may also sometimes be referred to as a "high aspect ratio interposer." High-aspect ratio columnar conductors typically have an aspect ratio of at least about 1.5 and preferably greater than two.

In any and all of the exemplary embodiments described herein, the position and location of the various elements, particularly the columnar via conductors, of the particular embodiment are shown in arbitrary positions for purposes of illustration, but in an actual embodiment for a particular application, such elements would be in respective positions corresponding to the contacts of the semiconductor die, circuit substrate, printed wiring board or other electronic device, to which such columnar conductors are intended to connect.

FIG. 1 is a cross-sectional schematic diagram of a step in the method for making an exemplary high aspect ratio interposer 10 according to the invention. A sheet 20 of suitable electrically conductive metal, such as copper, aluminum, brass, tin, or the like, is provided having a suitable thickness T. One or both broad surfaces of metal sheet 20 are then patterned, such as by photo-etching or other suitable means, either simultaneously or serially, to form columns 22, 24 extending from a remaining thin residual web 26 of the metal sheet 20. Photo-etching of metal sheet 20 may utilize standard photo-resists applied through suitable masks thereby defining the pattern to suitable tolerances, e.g. as fine as a few micrometers (microns). Photo-imaging, such as semiconductor grade photo-imaging, may be utilized to obtain finer patterns, e.g., columns 22, 24 of less than 25 $\mu$m (1 mil) width or diameter. Residual web 26 need only be of sufficient thickness to retain columns 22, 24 in relative positions temporarily during subsequent processing. The patterning of metal sheet 20 or a subsequent step may also form guide holes 28 useful in properly positioning and aligning the relative positions of metal sheet 20 and the masks, stencils or other pattern-defining objects (not illustrated), such as for the depositing of photo-resist, patterned etching material, precious metal plating, dielectric adhesive and the like.

Each of columns 22 is typically coaxial with a corresponding one of columns 24 and is typically cylindrical in shape, although a cross-sectional shape other than circular may be employed, e.g., square, hexagonal, oval and the like. The distal ends of columns 22, 24 are coated with a solderable and/or oxidation resisting conductive coating 30, such as a layer of a precious or noble metal, such as by plating or other metallization, for example, either before or after the etching of metal sheet 20 to form columns 22, 24, and either before or after the depositing of dielectric adhesive 40.

A layer 40 of electrically insulating or dielectric adhesive is deposited onto metal sheet 20 so as to fill in the volume defined by one of columns 22 or 24 and residual web 26, i.e. to surround the columns 22 or 24 with dielectric adhesive that is then B-staged or dried or cured, as appropriate, to attain sufficient strength to support columns 22, 24 after the residual web 26 is removed, e.g., as by etching away. As illustrated, dielectric adhesive layer 40 is deposited to surround conductive columns 24. Removal of web 26 electrically isolates ones of columnar conductors 22, 24 from others of the columnar conductors 22, 24 to produce a resulting structure including a pattern of electrically isolated columnar conductors 22, 24 that are held in relative position by a layer 40 of B-staged or dried dielectric adhesive 30, as illustrated in FIG. 2.

Figure 2:
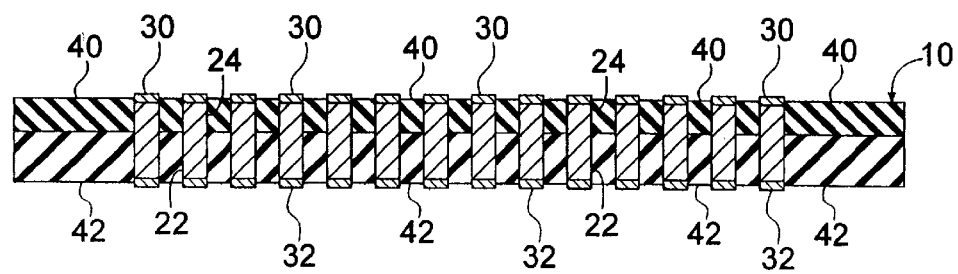
FIG. 2 is a cross-sectional schematic diagram illustrating a later step in the making of the exemplary high aspect ratio interposer of FIG. 1 according to the invention.

FIG. 2 is a cross-sectional schematic diagram of a later step in the making of a high aspect ratio interposer 10 of FIG. 1 according to the invention. Optionally, additional dielectric adhesive 42 may be deposited to surround columns 22 (for the illustrated example where the first applied dielectric layer 40 surrounds columns 22) thereby to provide a thicker dielectric layer 40, 42, such as for greater mechanical strength or for greater dielectric strength.

In a typical embodiment, flexible interposer 10 so formed may be as follows. A sheet 20 of "2-ounce" copper or "4-ounce" copper, i.e. copper having a thickness of about 75 $\mu$m (about 3 mils) or 150 $\mu$m (about 6.8 mils), respectively, as employed in fabricating conventional printed wiring circuit boards, may be utilized for making a flexible interposer having via conductors 22, 24 having a diameter or width of about 25 $\mu$m (about 1 mil), i.e. having an aspect ratio of about 3, or of about 100 $\mu$m (about 4 mils), respectively. A sheet 20 of "1-ounce" copper which is about 37 $\mu$m (about 1.5 mil) thick may be utilized where conductors 22, 24 have a diameter of about 13 $\mu$m (about 0.5 mil), likewise having an aspect ratio of about 3. Preferably, a layer 30 of precious metal such as silver, gold, palladium, or a layer of gold or palladium over a layer of nickel (nickel-gold or nickel-palladium), or tin, is patterned on copper sheet 20 prior to the etching to form columns 22 and/or 24. Copper sheet 20 is etched away in a pattern to form columns 22, 24 until the thickness of residual web 26 is about 13–25 $\mu$m (about 0.5–1 mil). Where the thicker 4-ounce copper is utilized, etching may proceed to form columns 22, 24 having a height of about 75–125 $\mu$m (about 3–5 mils). Suitable dielectric adhesives 30 include thermoplastic adhesives, thermosetting adhesives, B-stageable epoxies, and combinations and blends thereof. Exemplary suitable dielectric adhesives include types CC7450, ESP7450, ESP7450-SC, ESP7670 and ESP7670-SC flexible dielectric thermosetting adhesives available from AI Technology, Inc. located in Princeton Junction, N.J. Desirably, the dielectric adhesive should have a high flow characteristic while providing suitable bond strength, and should have a dielectric constant less than 6.0 and a dielectric strength of at least about 12,000 volts/mm (about 300 volts/mil). Typically, the dried or B-staged thickness of the dielectric adhesive 40 is about 60–70% of its wet (as applied) thickness. Thus, an about 150 $\mu$m (about 6 mils) thick wet adhesive typically dries to a thickness of about 100 $\mu$m (about 4 mils).

At a convenient point in the processing of interposer 10, either before or after the etching to form columns 22, 24 or before or after the applying of dielectric layer 40, a coating 30, 32, it is desirable that a coating of precious or noble metal be applied to the distal ends of columnar conductors 22, 24, e.g., a layer of silver, palladium or nickel/gold. For later direct bonding attachment of interposer 10 to contacts of a semiconductor die, next-level substrate or other electronic device, a pattern of "bumps" of electrically-conductive adhesive may be deposited on the precious metal coating 30, 32, for example. Suitable electrically-conductive adhesives include, for example, types PSS8150, ESP8450, ESS8450, ESP8680 and TP8150, also available from AI Technology, which are dry to the touch after B-staging and thus facilitate easy handling and assembly.

Where the diameter of columnar conductors 22, 24 is 25 $\mu$m (about 1 mil) or less and the aspect ratio is substantially greater than unity, they in combination with dielectric adhesive layer 40 form in effect an anisotropically electrically conductive adhesive sheet 10, also referred to as a Z-axis conductive or uniaxially conductive sheet. The dielectric adhesive layer 40 employed therein may be, for example, a rigid adhesive of the same sort as is included in AI Technology type ZEF8418 rigid anisotropic adhesive sheet or a flexible adhesive of the same sort as is included in AI Technology type ZEF8450 flexible anisotropic adhesive sheets, in each case minus the electrically-conductive filler particles thereof. A pattern of electrically-conductive adhesive may be applied to the distal end of conductive columns 22 and/or 24 for providing electrical connection to an electronic device proximate thereto. Alternatively, a Z-axis anisotropically electrically conductive adhesive may be employed therewith, for example, type ZEF8418 rigid adhesive or type ZEF8450 flexible adhesive, both available from AI Technology, as desired, for providing electrical connection to the contacts of an electronic device.

Oftentimes, the dielectric adhesive employed as dielectric layer 30 is a flexible adhesive, i.e. an intrinsically or molecularly flexible dielectric adhesive. By employing an intrinsically or molecularly flexible "interposer" or intermediate substrate, the stress build up of the rigid prior art packages is avoided and reliable electronic packages, including chip-scale packages, may be inexpensively made. An intrinsically flexible or molecularly flexible material is a material that is flexible as a result of its molecular structure, and not just because it has been formed into a very thin sheet. Aluminum, steel, and glass can be flexed if made thin enough, but none is intrinsically flexible. As used herein, flexible means a material that has a modulus of elasticity that is less than about 35,000 kg/cm$^2$ (about 500,000 psi) and that withstands an elongation of at least 30% in length without failure. Conventional substrate materials, such as FR4 laminate and polyimide, each of which have a modulus of elasticity of about 140,000 kg/cm$^2$ (about 2,000,000 psi), and bismaleimide-triazine, are not flexible as that term is used herein. Suitable flexible adhesives have a modulus of elasticity that is less than about 35,000 kg/cm$^2$ (about 500,000 psi) and preferred flexible adhesives have a modulus of elasticity that is less than about 7,000 kg/cm$^2$ (about 100,000 psi).

It is noted that in certain applications a flexible dielectric adhesive is not necessary and a rigid dielectric adhesive 40 may be employed. Examples of such application conditions may include, for example, where the edge dimension of the semiconductor die is small (e.g., less than 5 mm on any side), or where the aspect ratio of the via conductors 22, 24 is greater than about 2 and a flexible electrically-conductive adhesive is utilized to make electrical connection to the semiconductor die and/or to the next-level circuit substrate, or where the entire range of temperature to which an assembly of an semiconductor die, high aspect ratio interposer and next-level circuit substrate will be exposed is moderate (e.g. less than 50–75° C.), or where the number of temperature cycles is small (e.g., less than 100).

In addition, it is desirable that dielectric adhesive 40, 42 be flowable under the conditions of heat and/or pressure utilized in connecting interposer 10 to a semiconductor die, electronic circuit, substrate or other component so that dielectric adhesive 40, 42 will come into intimate contact therewith for additional mechanical strength.

It is further noted that not all of columnar conductors 22, 24 need be of the same size or shape, but they may be of differing sizes (e.g., of width or diameters from 25 $\mu$m to 2.5 mm (about 1 mil to 100 mils)) and shapes, and may be patterned as appropriate to the particular semiconductor die and next-level circuit substrate employed. Corresponding ones of columns 22 and 24 are electrically isolated for other corresponding ones of columns 22, 24. Columns 22, 24 may be coaxial or may be offset axially and connected by a conductor formed by selective etching away of residual web 26 where it is desired to have a different contact pattern at each surface of interposer 10, i.e. to have "fan out" of the contact pattern. While an interposer 10 may be formed individually, and may be of a size suitable for use with an individual semiconductor die or with a large semiconductor wafer, an number of interposers 10 may be formed contemporaneously from a single sheet 20 of metal. Such sheet of metal may be a panel, such as an about 30 mm by 30 mm (about 12 inch by 12 inch) sheet, or may be a long strip or web, such as an about 30 mm (about 12 inch) wide strip from a roll or reel, which may or may not have sprocket holes or other features for controlled positioning and/or imparting controlled motion.

Figure 3:
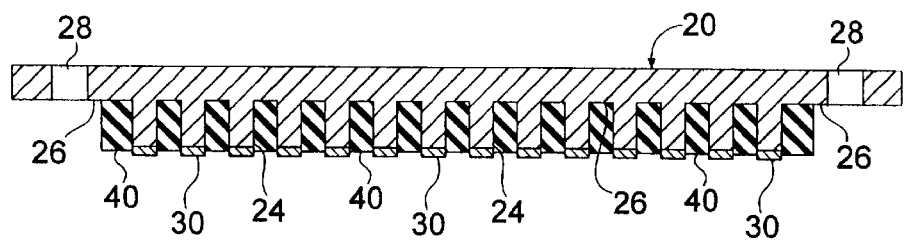
FIG. 3 is a cross-sectional schematic diagram illustrating an alternative step in the making of a an exemplary high aspect ratio interposer according to the invention.

FIG. 3 is a cross-sectional schematic diagram of an alternative step in the making of a an exemplary high aspect ratio interposer 10 according to the invention. In the step illustrated in FIG. 3, etching of copper sheet 20 is from one surface only to form columnar conductors 24 only, and dielectric layer 40 is applied to surround and retain columns 24 in their respective positions. The distal ends of columns 24 are coated with an oxidation resistant coating 30, such as silver, palladium or nickel/gold. After dielectric layer 40 is applied and B-staged or cured, as appropriate to the adhesive employed for resisting the etchants utilized in subsequent steps.

Figure 4:
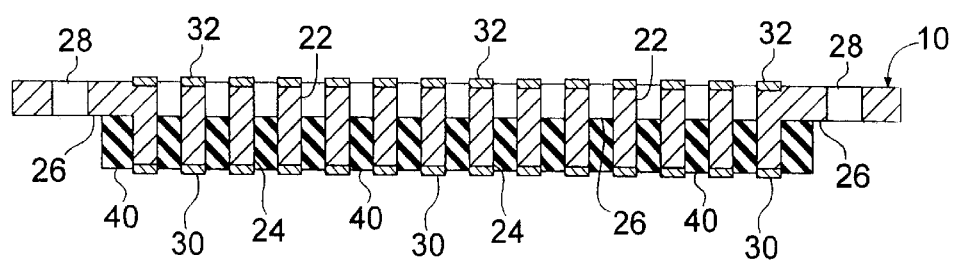
FIG. 4 is a cross-sectional schematic diagram illustrating a later alternative step in the making of the exemplary high aspect ratio interposer of FIG. 3 according to the invention.

FIG. 4 is a cross-sectional schematic diagram of a later alternative step in the making of a high aspect ratio interposer 10 of FIG. 3 according to the invention. Additional patterning of copper sheet 20 removes the residual web 26 and such etching away of copper sheet 20 leaves electrically isolated conductors 22 in their respective positions supported by dielectric adhesive 40. Because the embodiment of FIGS. 3 and 4 is suitable for thicker metal sheets 20, such as the 4-ounce copper described above, as well as for columnar conductors 24 having a diameter of about 75 $\mu$m (about 3 mils) or more, it is not necessary to fill in the etched-open spaces between columnar conductors 24 with dielectric adhesive. Of the about 170–175 $\mu$m (about 6.8 mil) thickness of 4-ounce copper sheet 20, the first etching illustrated in FIG. 3 is to a depth of about 75–125 $\mu$m (about 3–5 mils) which is filled with dielectric adhesive 40, and so the open spaces formed by the etching away of residual web 26 are about 50–100 $\mu$m (about 2–4 mils) deep and need not be filled with dielectric adhesive, but may be so filled if desired. The exposed distal ends of columnar via conductors 24 may be, and preferably are, coated with a precious metal, such as silver, palladium or nickel/gold, or may be tinned for soldering.

Bumps of electrically conductive adhesive may be patterned onto one or both distal ends of conductors 22 and/or 24 of interposers 10 as described for direct bonding to corresponding contacts of an electronic device or substrate, if desired. Interposer 10 is then attached to an electronic device (or the electronic device is attached to interposer 10) by heating one or both to a temperature sufficient to melt-flow the conductive adhesive bumps which cool to form connections between contacts of the electronic device and ones of the columnar conductors 22, 24. If the conductive adhesive is a thermosetting adhesive in whole or in part, then the adhesive is cured, usually at an elevated temperature. Common melt flow temperatures may be in the range of about 80–150° C.

Unfortunately, the temperature difference between the melt flow temperature of certain conductive adhesives and ambient temperature results in differences in thermal expansion that may tend to cause misalignment of the contacts of the electronic device and the interposer. In addition, such temperature difference, and more so for the lower temperatures to which the assembled device may be exposed, also results in the build up of stress. These problems are more pronounced for larger electronic devices and interposers, and make the attachment of interposers to semiconductor devices at the wafer level, i.e. before the wafer is separated into individual semiconductor die, more difficult, if not impossible.

By applying bumps of an electrically conductive adhesive that has pressure sensitive adhesive properties and that cures in-situ at a temperature at or near room or ambient temperature, the problems due to differential thermal expansion identified in the previous paragraph may be substantially avoided. One benefit of this is that adhesive bumping and interposer attachment may be performed for a large device and interposer, such as for one the size of a semiconductor wafer. Suitable electrically-conductive adhesives desirably provide an immediate bond strength of at least about 7 kg/cm$^2$ (about 100 psi) and cure at a temperature in the range of about 40–60° C., or after exposure to such temperature to activate its curing process, to a cured bond strength of about 70 kg/cm$^2$ (about 1000 psi). Suitable pressure sensitive electrically-conductive adhesives include type CB8205-E which is a B-stageable intrinsically-flexible thermosetting adhesive having an immediate bond strength in excess of 7 kg/cm$^2$ (about 100 psi) and which cures at about 60° C. to have a bond strength in excess of 70 kg/cm$^2$ (about 1000 psi).

If necessary or desired, an electronic device so attached to a flexible interposer may be underfilled with a compatible suitable low-viscosity dielectric adhesive, such as AI Technology type MEE7650-5, either before or after the curing of the electrically-conductive adhesive bumps. Preferably, both the CB8205-E conductive adhesive and the MEE7650-E dielectric adhesive are cured at a temperature as close to ambient temperature as possible. Where the interposer is applied to a semiconductor wafer, the wafer and the interposer attached thereto are both singulated at the same time to provide semiconductor die having a flexible interposer attached thereto.

It is also noted that a typical interposer 10 may have high aspect ratio columnar conductors 22, and/or 24 that are about 100–1000 $\mu$m (about 4–10 mils) in length and about 25–100 $\mu$m (about 1–4 mils) in diameter, and so have at least a limited ability to flex and bend to absorb thermal expansion differences between the electronic device and next-level substrate connected thereby. In addition, the intrinsic flexibility of the dielectric adhesive layer 40 also tends to reduce such thermal stress, as will the flexibility of flexible electrically-conductive adhesive connection bumps where solder bumps are not utilized.

In all respects, the method, materials, process steps, and various arrangements, such as straight through conductors and fanned out conductors, individual and mass fabrication, individual and wafer level interposer attachment, set forth above in relation to FIGS. 1 and 2 are fully applicable to the embodiment of FIGS. 3 and 4.

FIGS. 5, 6, 7, 8 and 9 are cross-sectional schematic diagrams of alternative steps subsequent, for example, to the step of FIG. 3, for further increasing the aspect ratio of conductors of any of the exemplary embodiments of an interposer according to the invention.

Figure 5:
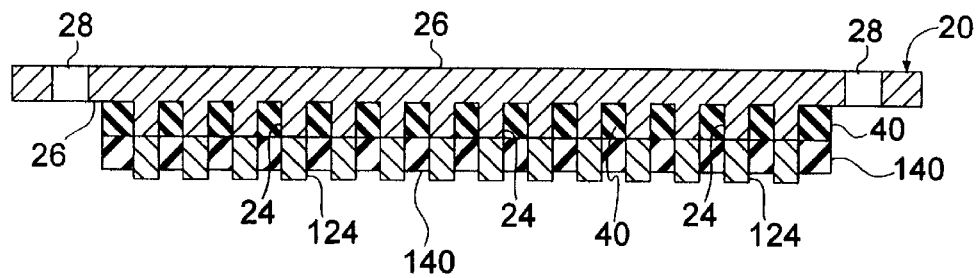
FIGS. 5, 6, 7, 8 and 9 are cross-sectional schematic diagrams illustrating a sequence of alternative steps subsequent to the step of FIG. 3 for further increasing the length and/or aspect ratio of conductors in an alternative embodiment of an exemplary interposer according to the invention.
Figure 6:
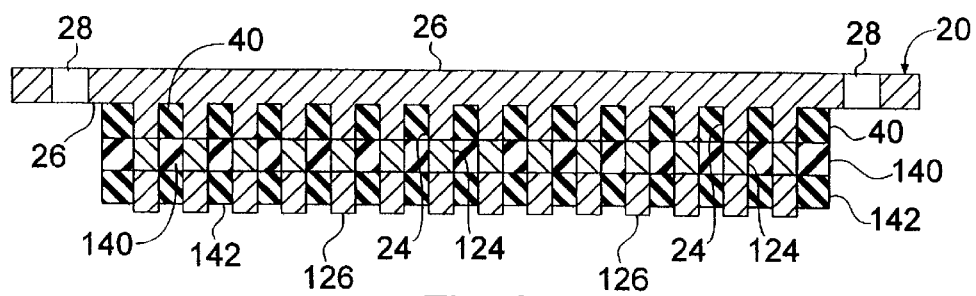
Figure 7:
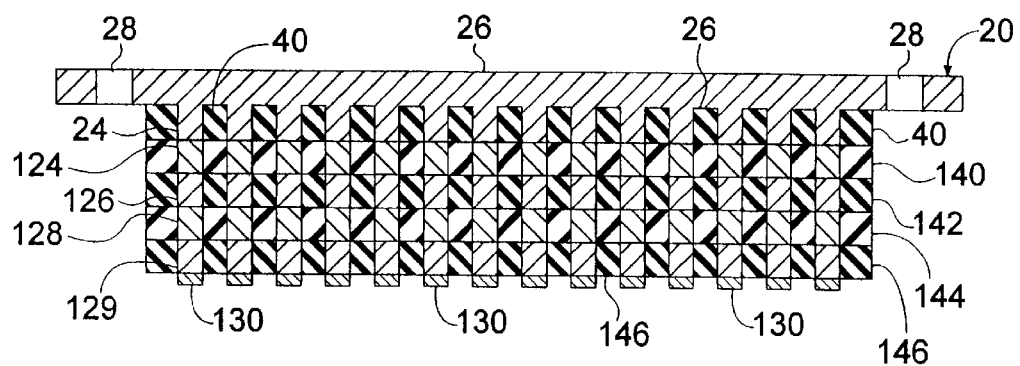

In FIG. 5, an additional thickness of conductive material 124 is deposited onto the distal ends of conductive columns 24 so as to increase the length thereof, i.e. the distance they extend from the residual web 26 of metal sheet 20 of copper or other metal. The volume between and surrounding conductive column portions 124 is filled with dielectric adhesive 140 that is then dried, B-stages or cured, as appropriate. The build up of electrically conductive material 124 may be either a deposition of electrically conductive adhesive, preferably a flexible conductive adhesive, or of a metal compatible with the metal of sheet 20 that is plated or otherwise deposited onto the distal ends of conductive columns 24. Suitable dielectric and conductive adhesives are as set forth above, and may be applied to a wet thickness of about 225 μm (about 9 mils) so to have a dried/B-staged and cured thickness of about 150 μm (about 6 mils). Similarly, adhesive applied to a wet thickness of about 150 μm (about 6 mils) will have a dried/B-staged and cured thickness of about 100 μm (about 4 mils). Where one layer of an adhesive is applied onto another layer of adhesive soluble in a compatible solvent, the first layer is typically cured prior to applying the second layer thereon. Conductive via portions 124 may be built up either before or after dielectric layer 140 is applied.

Where conductive vias of even greater height, and thus even greater aspect ratio, are desired, an additional layer may be built up as illustrated in FIG. 6. In FIG. 6, another additional thickness of conductive material 126 is deposited onto the distal ends of conductive columns 124 so as to increase the length thereof, i.e. the distance they extend from the residual web 26 of metal sheet 20. The volume between and surrounding conductive column portions 126 is filled with dielectric adhesive 142 that is then dried, B-stages or cured, as appropriate. The build up of conductive material 126 may be either a deposition of electrically conductive adhesive, preferably a flexible conductive adhesive, or of a metal compatible with the metal of sheet 20 that is plated or otherwise deposited onto the distal ends of conductive columns 124, as described above in relation to FIG. 5. Conductive via portions 126 may be built up either before or after dielectric layer 142 is applied. Where conductor portion 126 is plated metal and conductor portion 124 is electrically-conductive adhesive, the conductive adhesive is coated with a layer of precious or noble metal, such as silver, palladium or nickel/gold, onto which copper or other metal 126 is plated or otherwise deposited. Where metal is so deposited, it may be deposited as a layer that is subsequently patterned to leave conductive column portions 126 or may be selectively deposited in a pattern corresponding to the pattern of conductors 124 using conventional photoresist.

Where conductive vias of yet even greater height, and thus even greater aspect ratio, are desired, one or more additional layers may be built up as illustrated in FIG. 7. In FIG. 7, one or more additional thicknesses of conductive material 128, 129 is deposited onto the distal ends of conductive columns 126 so as to increase the length thereof, i.e. the distance they extend from the residual web 26 of metal sheet 20. The volume between and surrounding conductive column portions 128, 129 is filled with dielectric adhesive 144, 146 that is then dried, B-stages or cured, as appropriate. The materials, the build up thereof, and the order of the build up, is all as described above in relation to FIGS. 5 and 6. Whether the last conductor portion 129 is plated up metal or electrically-conductive adhesive, it is preferably coated with a layer of precious or noble metal, such as by electrolytically plating layers of silver, palladium or nickel/gold thereon, as described above.

Figure 8:
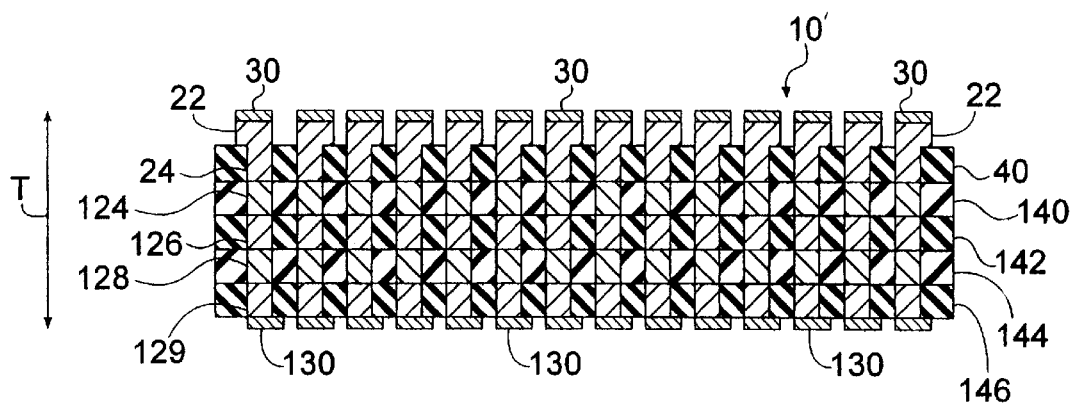

FIG. 8 illustrates the step of electrically isolating the conductive columns 22 from metal sheet 20 by the removal of residual webs 26 therefrom, such as by etching or other suitable means, thereby producing interposer 10'. This step is performed whether conductive columns 22 are substantially co-linear with conductive columns 24 or are offset therefrom and joined thereto by a conductor provided by a remaining portion of residual web 26 so as to provide contact fanout. A layer of precious or noble metal 30, such as silver, palladium or nickel/gold, is applied to the distal ends for conductive columns 22, either prior to or after the removing of web 26, such as for providing resistance to oxidation and solderability.

Figure 9:
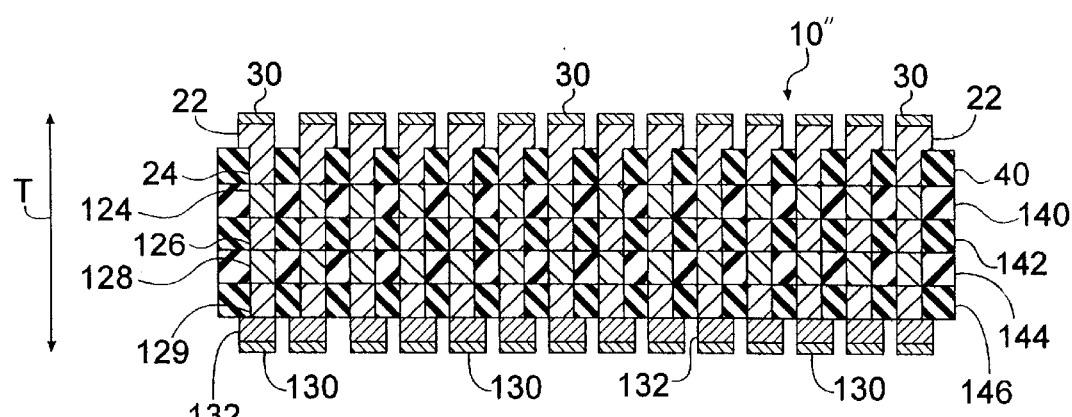

FIG. 9 illustrates yet another alternative step for extending the length of the conductive columns 22–24–124–126–128–129 further yet by further building up metal 132, such as plated copper, on conductive via portions 129 prior to applying the layer 130 of precious or noble metal thereon.

It is noted that the steps illustrated in FIGS. 5–9 are particularly useful where the diameter or width of conductive vias 24, 124, 126, . . . is relatively large, e.g., greater than about 75–150 μm (about 3–6 mils), so that an aspect ratio of about 2 or larger may be obtained even though the thickness of any one layer of dielectric adhesive or of electrically conductive adhesive typically would not produce conductive vias having such high aspect ratio. For example, the method of FIGS. 5–8 can be utilized to produce an interposer 10' having a thickness of about 0.5 mm (about 20 mils) with columnar conductive vias of about 225 μm (about 9 mil) diameter and about 0.5 mm (about 20 mils) length.

Figure 10:
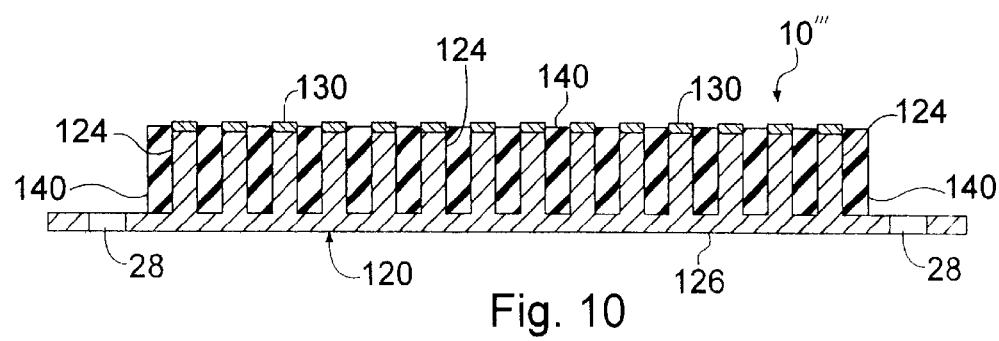
FIG. 10 is a cross-sectional schematic diagram illustrating an alternative step in the making of a an exemplary high aspect ratio interposer according to the invention.

FIG. 10 is a cross-sectional schematic diagram of an alternative step in the making of an exemplary high aspect ratio interposer 10'" according to the invention, and is usable for obtaining an aspect ratio of at least three, or higher. A sheet of metal 20 is provided that can receive thin wires 120 bonded thereto such as by heat and/or ultrasonic welding using a conventional wire bonder. Typically, the metal sheet 20 is a panel or is in strip or roll form and is advanced linearly in steps into the work space of a conventional wire bonder which welds bond wires 120 thereto in a row-by-row fashion, and/or in a desired pattern and spacing. Suitable metal sheets 20 include, e.g., copper, aluminum and alloys thereof of suitable thickness. Suitable wire 120 includes thin gold, copper and aluminum wire, such as that utilized in connecting to the contacts of semiconductor die. The bonded thin wire 120 is cut off at a desired length by the wire bonder to provide columnar conductors 120 perpendicular to metal sheet 20. Metal sheet 20 may include holes 28 which serve as guide holes for aligning sheet 20 with respect to the work space of the wire bonder and/or deposition masks or stencils described below, and which may be sprocket or drive holes for advancing sheet 20.

A flexible dielectric adhesive 140 is deposited on metal sheet 20 to surround the thin wire columnar conductors 120, such as by mask deposition, stenciling, screen printing, roll coating or laminating, as desired. Dielectric adhesive 140 is dried, B-staged and/or cured so as to provide sufficient strength to support and electrically isolate conductors 120 and to resist the chemicals and solvents utilized in the etching of metal sheet 20. If copper wires 120 are employed, the ends or tips thereof should be coated with an oxidation resistant metal 130, e.g., a precious metal such as silver, nickel/gold, palladium or the like, preferably prior to depositing dielectric adhesive into the volume between the bonded wires 120. After deposition of dielectric layer 140, metal sheet 20 is etched away in a pattern that removes the web 126 portions thereof and leaves an additional length of columnar conductor 122 on the end of each columnar conductor 120, thereby providing a higher aspect ratio conductor. The exposed ends of columnar conductors 122 are preferably plated with a precious or noble metal as described. Thus, the resulting interposer 10''' is substantially like interposer 10 shown in FIG. 2.

In a typical embodiment, interposer 10''' includes a sheet 20 of "1–2 ounce" copper, i.e. copper having a thickness of about 35–75 μm (about 1.5–3 mils), to which gold or copper wires of about 6–13 μm (about ¼–½ mil) diameter are bonded to extend substantially perpendicularly therefrom. Suitable dielectric adhesives include types TP7150 and TP7090 thermoplastic adhesives and types ESP7450, ESP7450-SC, ESP7670 and ESP7670-SC thermosetting adhesives, available from AI Technology. When such thin or superfine bond wires are employed, the patterning and etching of metal sheet 20 to remove web 26 may utilize semiconductor grade photo-imaging.

It is noted that an interposer 10''' using such thin (e.g., about 6–13 μm (about ¼–½ mil) diameter) bond wires 124 may have the bond wires 124 placed in an electrically-isolated pattern corresponding to an electronic device to which it is to be attached or may have the thin bond wires 124 placed in a closely-spaced, fine-pitch, substantially uniform electrically-isolated pattern so as to produce an interposer 10'' that may be utilized as a Z-axis or anisotropically conductive dielectric sheet. In such case, the dielectric adhesive may be either rigid or flexible, comparable to conventional Z-axis adhesives such as AI Technology types ZEF8418 and ZEF8450.

Further, copper sheet 20 may be entirely etched away whereby the ends of the gold or copper thin bond wires 124 are exposed at both ends, the ends preferably being plated, if copper. Thicker diameter bond wires 124 may also be employed so as to provide larger diameter columnar conductors 124, 122, e.g., in the range of about 25 μm to 2.5 mm (about 1–100 mils) in diameter. In addition, either surface of interposer 10''' may receive electrically conductive adhesive for providing interconnection to the contacts of electronic devices, such as a pattern of flexible conductive adhesive bumps for bonding to contacts of a semiconductor die, preferably contacts having a precious metal layer.

Figure 11A:
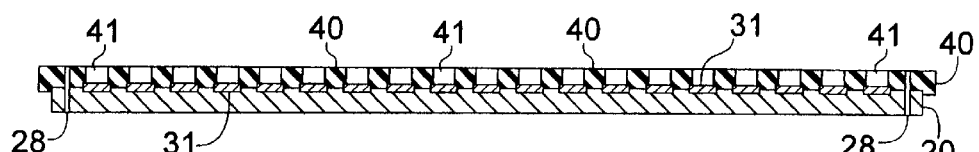
FIGS. 11A, through 11D are cross-sectional schematic diagrams illustrating steps in the making of an electronic device including an exemplary interposer according to the invention.
Figure 11B:
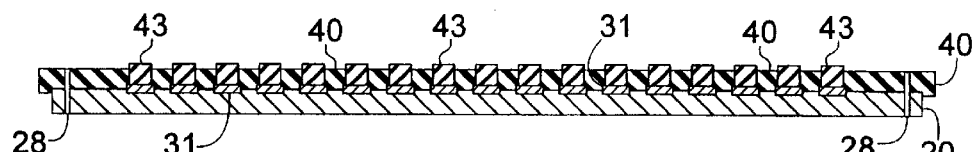
Figure 11C:
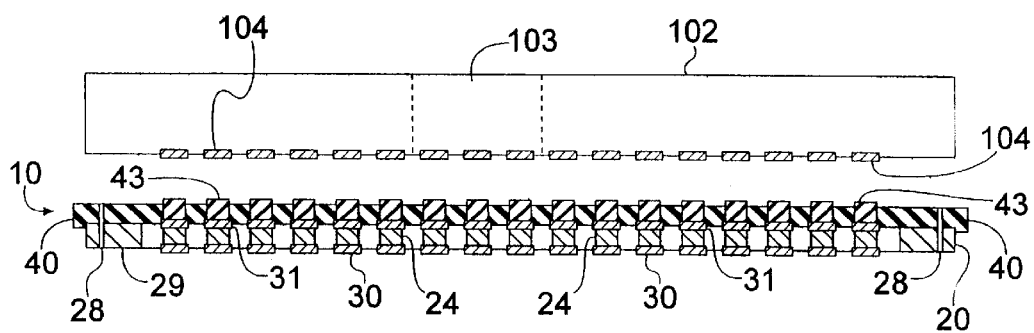
Figure 11D:
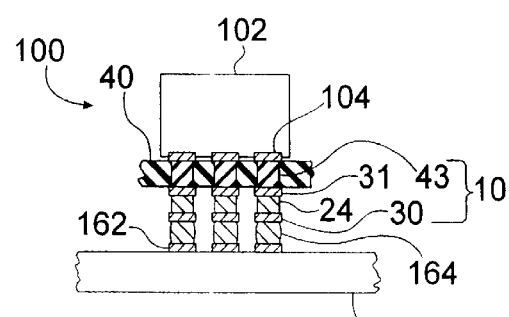

FIGS. 11A, through 11D are cross-sectional schematic diagrams illustrating steps in the making of an electronic device 100 including a semiconductor die 103 and an exemplary interposer 10 from a semiconductor wafer 102. The semiconductor wafer 102 is typically a large circular sheet of silicon, gallium arsenide, indium phosphide, or other semiconductor material, on which is formed a plurality of individual electronic circuits. After the circuits are formed, the individual circuits are excised or singulated from the wafer, i.e. the circuits are separated from each other. The separated electronic circuits are often referred to as semiconductor die or chips 103.

FIG. 11A shows a metal sheet 20, e.g., of copper or other suitable metal, that is at least as large as a semiconductor wafer 102 (not shown). A layer of dielectric adhesive 40 is applied on metal sheet 20 and has a plurality of blind vias 41 therethrough exposing sites on one surface of metal sheet 20. Vias 41 are in a pattern that corresponds to the pattern of contacts 104 of a semiconductor wafer 102 to which interposer 10 is to be connected, and may be provided in the depositing of dielectric adhesive layer 40, such as by a mask, screen or stencil, or by photo-imaged or laser techniques, as desirable and convenient. Suitable dielectric adhesives are identified above and, preferably, dielectric adhesive 40 is a flexible adhesive having a low modulus of elasticity and low dielectric constant and loss. An oxidation resistant metal layer or metallization 30, such as nickel-gold, is patterned onto one or both surfaces of metal sheet 20 at any convenient point in the process of making interposer 10. Metallization 30 at the bottoms of vias 41 are identified as metal layer 31. Guide holes or other fiducial marks 28 may also be provided, such as for aligning masks, stencils and the like with respect to metal sheet 20 and for aligning metal sheet 20 and interposer 100 with respect to the semiconductor wafer.

FIG. 11B shows the depositing of electrically-conductive adhesive 43 into vias 41. Suitable conductive adhesives are identified above and, preferably, conductive adhesive 43 is a flexible adhesive having a low modulus of elasticity. An oxidation resistant metallization 31, such as nickel-gold, may be patterned onto metal sheet 20 at the bottoms of blind vias 41 at any convenient point in the process.

FIG. 11C illustrates the steps including the etching away of portions of metal sheet 20 to form solid-metal columnar conductors 24 extending from the bumps of conductive adhesive 43 that were deposited in vias 41, thereby to form exemplary interposer 10. Columnar conductors 24 are typically cylindrical and of like or greater diameter than are conductive adhesive bumps 43, and the distal end thereof is coated with a precious metal layer 30 applied at a convenient point in the process of forming interposer 10. Metal layer 30 is solderable if interposer 10 is to be soldered. Each set of columnar conductors 24 and conductive bumps 43 has an aspect ratio greater than 1.5 and, preferably, columnar conductor 24 has an aspect ratio greater than two. The etching away of metal sheet 20 may also be utilized to form an annular ring 29 of metal to provide additional mechanical support for interposer 10. Interposer 10 is aligned with and placed against semiconductor wafer 102 with ones of conductive adhesive bumps 43 against corresponding contacts 104 of semiconductor wafer 102 to provide respective connections therebetween. Conductive adhesive 43 is heated and/or cured to provide such connections. Preferably, a low-temperature curing conductive adhesive as described herein may be employed so as to minimize the differential thermal expansion between semiconductor wafer 102 and interposer 100.

Semiconductor wafer 102 with interposer 10 connected thereto is then singulated or separated into individual electronic circuits or die 103, each of which has a respective portion of interposer 10 connected thereto, as shown in FIG. 11D. Semiconductor die 103 or electronic circuit 103 may then be used directly or stored for later use. Semiconductor die or circuit 103 is connected to a next-level substrate 160, such as a printed circuit board, ceramic substrate or other substrate, which has contact sites 162 thereon corresponding to the columnar conductors 24 of the portion of interposer 10 connected to electronic circuit 103. Connections 164 between contacts 104 of die 103 and contact sites 162 of substrate 160 are, for example, provided by bumps 164 of solder or conductive adhesive, or by the conductive paths of a Z-axis conductive or uniaxially conductive sheet.

Figure 12A:
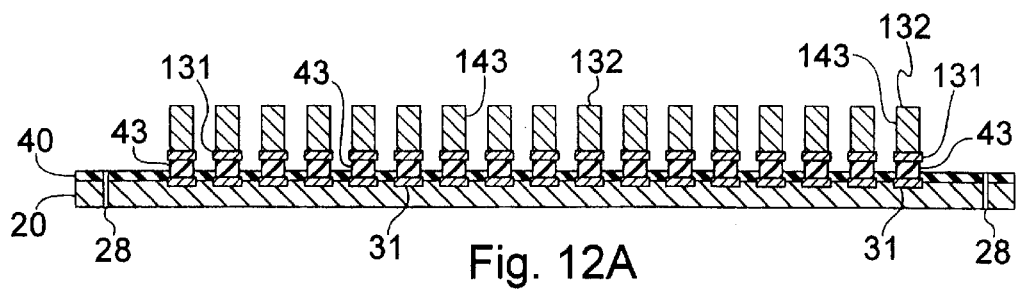
FIGS. 12A, and 12B are cross-sectional schematic diagrams illustrating alternative and/or additional steps in the making of an electronic device including an exemplary interposer according to FIGS. 11A through 11D.
Figure 12B:
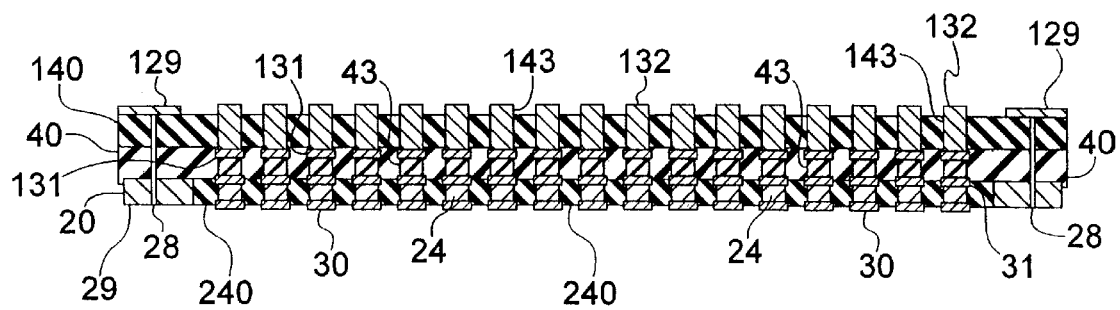

FIGS. 12A, and 12B are cross-sectional schematic diagrams illustrating alternative and/or additional steps in the making of an electronic device 100 including an exemplary interposer 10 relating to FIGS. 11A through 11D. Conductors 43 formed by conductive adhesive bumps 43 of FIG. 11B are extended by building up columnar conductor 143 thereon as shown in FIG. 12A, for example. Columnar conductor 143 may be built up by plating a column of solid metal, such as copper, nickel, silver, or gold, on conductive bumps 43 or by further depositing conductive adhesive, preferably a flexible conductive adhesive, thereon. Precious metal layer 131 provides an electrically stable interface between conductive adhesive 43 and metal 143.

In FIG. 12B is shown a further alternative wherein in relation to FIG. 11C one or two additional layers 140, 240 of dielectric adhesive are applied to the two surfaces of a dielectric adhesive 40 so as to increase the thickness and mechanical strength thereof. Preferably, layers 140, 240 are flexible dielectric adhesive having a low modulus of elasticity and low dielectric constant and loss, similar to dielectric layer 40. Further, an additional annular metal ring 129 may optionally be applied to dielectric layer 40 or 140 (as shown) also to increase the thickness and mechanical strength of interposer 10' for handling before it is connected to semiconductor wafer 102 or other panel of electronic substrates.

Wherever a copper columnar conductor or other metal conductor connects to an electrically conductive adhesive bump, a layer of nickel-gold, silver, palladium, or other oxidation resistant metal is preferably applied to the copper or other metal conductor or to the electrically conductive adhesive bump to provide a more stable and reliable connection at the interface therebetween.

While the method of FIGS. 11A through 11D and 12A through 12B is described in the context of a semiconductor wafer 102 including plural electronic circuits, it is equally applicable to any other electronic substrate, such as a printed wiring board, a ceramic substrate, a hybrid or microelectronic substrate or other electronic component or panel having plural electronic circuits or electronic components thereon that are separated into individual circuits at some point in its processing.

Figure 13:
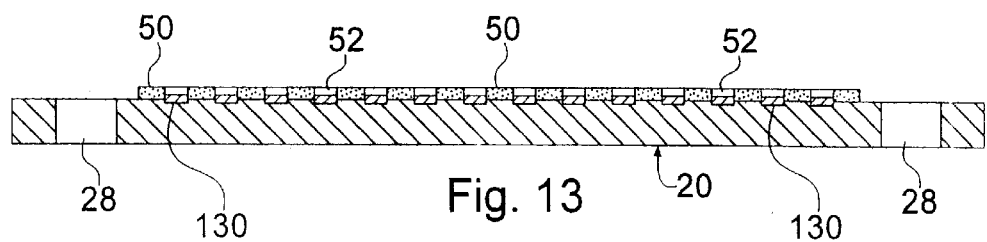
FIG. 13 is a cross-sectional schematic diagram illustrating a patterning step useful with ones of the exemplary embodiments of the foregoing FIGURES.

FIG. 13 is a cross-sectional schematic diagram of a patterning step useful with ones of the exemplary embodiments of the foregoing FIGURES. To the end of defining a pattern on metal sheet 20, a layer of a photo-sensitive resist material (photo-resist) 50 is applied to a broad surface of metal sheet 20 and is selectively exposed to light and developed to define the desired pattern. Such pattern may include, for example, a pattern for etching away portions of sheet 20 to form columnar conductors 22 or 24, or other conductors, or for otherwise removing material from metal sheet 20. Such pattern may also include, for example, a pattern of vias 52 for depositing a precious metal 130 on sites on a surface of metal sheet 20, or a pattern for depositing a patterned layer of electrically-conductive adhesive or of dielectric adhesive. Such photo-resist patterning may be utilized directly on metal sheet 20, or to provide additional thickness to a dielectric adhesive layer 140 or to lengthen a columnar conductor 22, 24, for example, as described in and in relation to FIGS. 5–9.

Figure 14A:
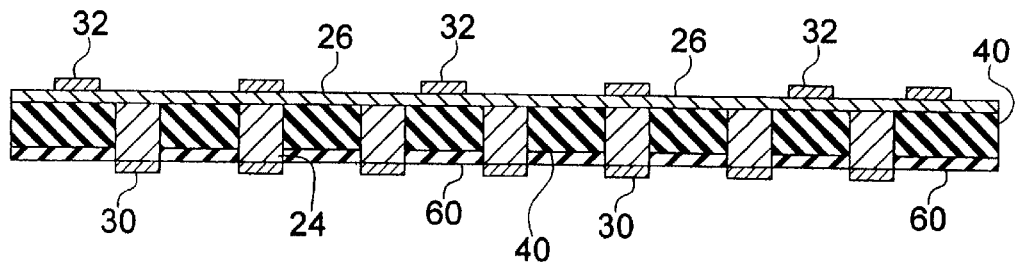
FIGS. 14A, 14B and 14C are cross-sectional schematic diagrams illustrating dielectric layering steps useful with the exemplary embodiments of the foregoing FIGURES.
Figure 14B:
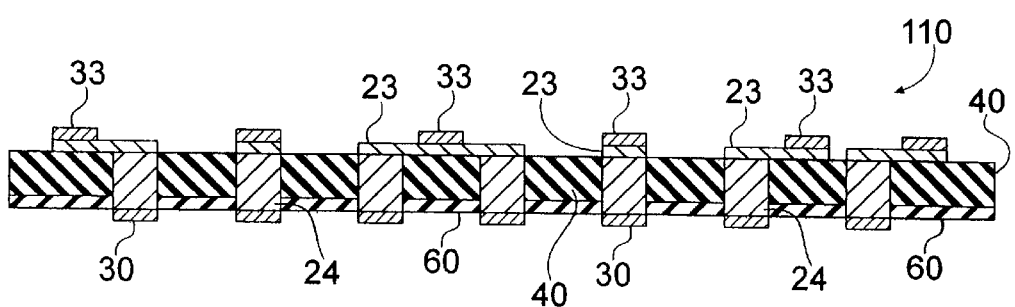
Figure 14C:
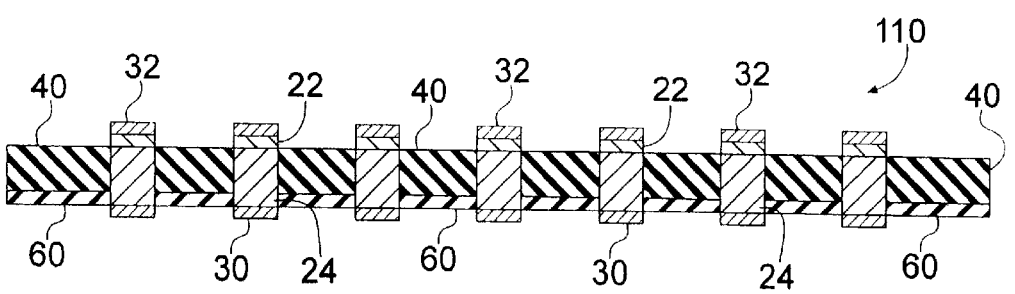

FIGS. 14A, 14B and 14C are cross-sectional schematic diagrams of a dielectric layering step useful with the exemplary embodiments of the foregoing FIGURES. FIG. 14A shows a step in making an interposer 110 wherein metal sheet 20 is etched away to define columnar conductors 24 and to leave web 26, and wherein dielectric adhesive layer 40 is deposited on web 26 to fill between and surround conductors 24. Patterned precious metal is deposited to provide contacts 30 on columnar conductors 24 and contacts 32 on web 26 wherein ones of contacts 32 are coaxially aligned with corresponding ones of columnar conductors 24 and others of contacts 32 are displaced laterally from columnar conductors 24. An additional dielectric layer 60 is applied over dielectric adhesive layer 40 so as to form a sandwich with dielectric adhesive layer 40 between the remaining web 26 of metal sheet 20 and dielectric layer 60.

Precious metal layer 30, 32 may be applied either before or after the etching of metal sheet 20, either before or after the forming of dielectric layer 40, and/or either before or after the placing of dielectric film 60.

Dielectric layer 60 is a non-adhesive dielectric film of a non-intrinsically flexible dielectric material, such as a polyimide or other high-temperature-resistant material. Suitable materials include, in addition to conventional polyimide, low-CTE polyimide films such as those available from Hitachi Chemical located in Japan and liquid crystal polymer films such as those available from Allied Chemical/Honeywell International, Inc. located in Morristown, N.J. Typically, dielectric film 60 has precut holes 64 in a pattern corresponding to the pattern of conductors 24.

Where dielectric adhesive layer 40 is applied with a wet thickness substantially the same as the height of columnar conductors 24, the drying or B-staging of adhesive layer 40 produces a reduction in thickness thereof that allows dielectric film 60 to be placed directly onto dielectric adhesive layer 40 with conductors 24 protruding through its precut holes 64. Where dielectric adhesive layer 40 is applied with a wet thickness in excess of the height of columnar conductors 24, the drying or B-staging of adhesive layer 40 produces a reduction in thickness thereof so that dielectric layer 40 has a dried or B-staged thickness that is about the same as the height of conductors 24, and dielectric film 60 is placed onto dielectric adhesive layer 40 and conductors 24 are built up, either by depositing metal or an electrically conductive adhesive, to fill precut holes 64 with conductive material. If there is a substantial difference in CTE between the dielectric adhesive layer 40 and the high-temperature dielectric film 60, such as where type CC7450 dielectric adhesive having a CTE of about 100–120 ppm/° C. and liquid crystal polymer which may be only about 25 $\mu$m (about 1 mil) thick and have a CTE of about 3–10 ppm/° C., a second layer of the same dielectric adhesive may be applied on the dielectric film 60 so that there is symmetry of structure which tends to reduce distortion and warpage due to differential thermal expansion. It is noted that despite the difference in CTE, however, the flexibility of the CC7450 flexible dielectric adhesive is about 700 kg/cm$^2$ (10,000 psi) and it withstands an elongation of at least 30% in length without failure avoids the build up of damaging thermal stress.

Advantages of interposer 110 having a high-temperature dielectric film 60 include physical strength and dimensional stability. In addition, because such dielectric films are conventionally utilized in electronic products, their established physical characteristics may lead to easier acceptance of the new interposers described herein. Dielectric film 60 may also be pre-printed with conductors that fan out from columnar conductors 24, as is conventional, thereby to provide a novel interposer having fanned out contacts 30.

In FIG. 14B, web 26 of metal sheet 20 is etched away to provide interposer 110 having conductors 22, 23, ones of which are columnar conductors 22 coaxially aligned with corresponding columnar conductors 24 and others of which are conductors 23 connecting contacts 33 that are fanned out with respect to the corresponding columnar conductors 24 that are not coaxially aligned therewith. In FIG. 14C, web 26 of metal sheet 20 is etched away to provide interposer 110 having columnar conductors 22 all coaxially aligned with corresponding columnar conductors 24, and with corresponding metal layers 30, 32.

While the present invention has been described in terms of the foregoing exemplary embodiments, variations within the scope and spirit of the present invention as defined by the claims following will be apparent to those skilled in the art. For example, while a particular material or processing operation is described in relation to a particular exemplary embodiment, each material and process may be, in general, utilized in any of the other exemplary embodiments. Accordingly, where a metal, precious, noble or otherwise, is deposited, such may be by electrolytic plating, electroless plating, flash deposition, sputtering or other suitable means. Where a layer of dielectric or conductive adhesive is applied, such may be by mask deposition, screen printing, stenciling, roll coating, laminating or other suitable means. Where an adhesive curing at a low temperature is described, it may be a thermosetting adhesive that cures at ambient temperature or above up to about 60° C., or may be cured by light, such as ultraviolet light.

In addition, a coating providing oxidation resistance and/or solderability may include any one or more of a layer of noble or precious metal, such as silver, palladium, or a layer of gold or palladium over a layer of nickel, also includes other suitable metals, as well as combinations and alloys thereof. Deposition or building up of metal may be by plating, either electroless or electrolytic, as appropriate, or by flash deposition, sputtering or any other suitable process.

The aspect of the method for increasing the aspect ratio of the conductors of an interposer, such as those shown in and described in relation to FIGS. 5–9 may be utilized with any of the exemplary embodiments herein, and to extend either or both ends of columnar conductors 22, 122 and/or 24, 124.

What is claimed is:

1. A method for making an interposer comprising:
   providing a sheet of metal;
   removing part of the sheet of metal to leave a plurality of columnar conductors having distal ends projecting from a remaining web of the sheet of metal;
   applying a layer of dielectric adhesive on the remaining web and surrounding the columnar conductors except for the distal ends thereof;
   removing at least part of the remaining web to electrically isolate ones of the columnar conductors from others of the columnar conductors.

2. The method of claim 1 wherein said removing part of the sheet of metal comprises removing a first part of the sheet of metal to leave a plurality of first columnar conductors having distal ends projecting from a first surface of the remaining web, and wherein said removing at least part of the remaining web comprises removing a second part of the sheet of metal to leave a plurality of second conductors ones of which are electrically connected to corresponding ones of the first columnar conductors.

3. The method of claim 1 wherein said removing part of the sheet of metal comprises removing a first part of the sheet of metal to leave a plurality of first columnar conductors having distal ends projecting from a first surface of the remaining web and removing a second part of the sheet of metal to leave a plurality of second columnar conductors having distal ends projecting from a second surface of the remaining web.

4. The method of claim 1 further comprising applying a layer of a conductive material on the distal ends of the columnar conductors.

5. The method of claim 4 wherein said applying a layer of a conductive material includes applying a layer of at least one of a metal, a precious metal, a noble metal, a combination thereof, an alloy thereof, solder, and an electrically conductive adhesive.

6. The method of claim 4 wherein said applying a layer of a conductive material includes applying a layer of at least one of copper, aluminum, brass, tin, solder, silver, gold, palladium, nickel, nickel/gold, nickel/palladium, a combination thereof and an alloy thereof.

7. The method of claim 1 wherein said applying a layer of dielectric adhesive includes applying a layer of a flexible dielectric adhesive.

8. The method of claim 7 wherein said applying a layer of flexible dielectric adhesive includes applying a dielectric adhesive that has a modulus of elasticity of less than about 35,000 kg/cm$^2$ (about 500,000 psi) and that withstands an elongation of at least 30% in length without failure.

9. The method of claim 7 wherein said applying a layer of flexible dielectric adhesive includes applying a dielectric adhesive that has a modulus of elasticity of less than about 7,000 kg/cm$^2$ (about 100,000 psi) and that withstands an elongation of at least 30% in length without failure.

10. The method of claim 1 further comprising:
    providing an electronic device having contacts thereon; and
    connecting the contacts of the electronic device to respective first ends of ones of the columnar conductors.

11. The method of claim 10 wherein said connecting the contacts includes:
    applying one of solder and electrically-conductive adhesive to one of the contacts of the electronic device and the first ends of ones of the columnar conductors; and
    joining the contacts of the electronic device and corresponding ones of the first ends of the ones of the columnar conductors with the one of the solder and the electrically-conductive adhesive.

12. The method of claim 10 further comprising:
    providing an electronic substrate having contact sites thereon; and
    connecting the contact sites of the electronic substrate to respective second ends of ones of the columnar conductors.

13. The method of claim 12 wherein said connecting the contact sites includes:
    applying one of solder and electrically-conductive adhesive to one of the contact sites of the electronic substrate and the second ends of ones of the columnar conductors; and
    joining the contact sites of the electronic substrate and corresponding ones of the second ends of the ones of the columnar conductors with the one of the solder and the electrically-conductive adhesive.

14. The method of claim 10 wherein said providing an electronic device includes:
    providing an electronic component having contacts thereon, and/or
    providing a semiconductor wafer including a plurality of electronic circuits thereon each having a pattern of contacts.

15. The method of claim 14 further comprising separating the semiconductor wafer into individual semiconductor die each including at least one of the electronic circuits and having the corresponding ones of the columnar conductors connected thereto.

16. The method of claim 1 further comprising applying on the layer of dielectric adhesive applied on the remaining web a film of a non-intrinsically flexible dielectric material.

17. The method of claim 16 wherein said applying a film of a non-intrinsically flexible dielectric material includes applying a film of one of a polyimide, a low-CTE polyimide and a liquid crystal polymer.

18. The method of claim 1 wherein the columnar conductors include at least a section that is solid metal and have an aspect ratio of at least 1.5.

19. A method for making a uniaxially conductive sheet comprising:

providing a sheet of metal;

removing part of the sheet of metal to leave a plurality of columnar conductors having distal ends projecting from a remaining web of the sheet of metal, wherein the columnar conductors are substantially uniformly and closely spaced;

applying a layer of dielectric adhesive on the remaining web and surrounding the columnar conductors except for the distal ends thereof;

removing at least part of the remaining web to electrically isolate ones of the columnar conductors from others of the columnar conductors.

20. The method of claim 19 wherein said removing part of the sheet of metal comprises removing a first part of the sheet of metal to leave a plurality of first columnar conductors having distal ends projecting from a first surface of the remaining web, and wherein said removing at least part of the remaining web comprises removing a second part of the sheet of metal to leave a plurality of second conductors ones of which are electrically connected to corresponding ones of the first columnar conductors.

21. The method of claim 19 wherein said removing part of the sheet of metal comprises removing a first part of the sheet of metal to leave a plurality of first columnar conductors having distal ends projecting from a first surface of the remaining web and removing a second part of the sheet of metal to leave a plurality of second columnar conductors having distal ends projecting from a second surface of the remaining web.

22. The method of claim 19 further comprising applying a layer of a conductive material on the distal ends of the columnar conductors.

23. The method of claim 22 wherein said applying a layer of a conductive material includes applying a layer of at least one of a metal, a precious metal, a noble metal, a combination thereof, an alloy thereof, solder, and an electrically conductive adhesive.

24. The method of claim 22 wherein said applying a layer of a conductive material includes applying a layer of at least one of copper, aluminum, brass, tin, solder, silver, gold, palladium, nickel, nickel/gold, nickel/palladium, a combination thereof and an alloy thereof.

25. The method of claim 19 wherein said applying a layer of dielectric adhesive includes applying a layer of a flexible dielectric adhesive.

26. The method of claim 25 wherein said applying a layer of flexible dielectric adhesive includes applying a dielectric adhesive that has a modulus of elasticity of less than about 35,000 kg/cm$^2$ (about 500,000 psi) and that withstands an elongation of at least 30% in length without failure.

27. The method of claim 25 wherein said applying a layer of flexible dielectric adhesive includes applying a dielectric adhesive that has a modulus of elasticity of less than about 7,000 kg/cm$^2$ (about 100,000 psi) and that withstands an elongation of at least 30% in length without failure.

28. The method of claim 19 wherein the columnar conductors include at least a section that is solid metal and have an aspect ratio of at least 1.5.

29. The method of claim 19 further comprising:

providing at least one of an electronic device having contacts thereon, an electronic component having contacts thereon, and/or a semiconductor wafer including a plurality of electronic circuits thereon each having contacts thereon; and connecting the contacts to respective first ends of the columnar conductors.

30. The method of claim 29 further comprising separating the semiconductor wafer into individual semiconductor die each including at least one of the electronic circuits and having the corresponding ones of the columnar conductors connected thereto.

31. A method for making an electronic device comprising:

providing a sheet of metal;

providing an electronic component having contacts thereon;

removing part of the sheet of metal to leave a plurality of columnar conductors having distal ends projecting from a remaining web of the sheet of metal;

applying a layer of dielectric adhesive on the remaining web and surrounding the columnar conductors except for the distal ends thereof;

removing at least part of the remaining web to electrically isolate ones of the columnar conductors from others of the columnar conductors; and connecting the contacts of the electronic component to respective first ends of ones of the columnar conductors.

32. The method of claim 31 wherein said connecting the contacts includes:

applying one of solder and electrically-conductive adhesive to one of the contacts of the electronic component and the first ends of ones of the columnar conductors; and joining the contacts of the electronic component and corresponding ones of the first ends of the ones of the columnar conductors with the one of the solder and the electrically-conductive adhesive.

33. The method of claim 32 wherein said applying one of solder and electrically-conductive adhesive includes applying a pressure-sensitive electrically-conductive thermosetting adhesive that cures at a temperature of less than about 60° C.

34. The method of claim 33 wherein the pressure-sensitive electrically-conductive thermosetting adhesive has an immediate bond strength of at least about 100 psi and has a cured bond strength of at least about 1000 psi.

35. The method of claim 31 further comprising:

providing an electronic substrate having contact sites thereon; and connecting the contact sites of the electronic substrate to respective second ends of ones of the columnar conductors.

36. The method of claim 35 wherein said connecting the contact sites includes:

applying one of solder and electrically-conductive adhesive to one of the contact sites of the electronic substrate and the second ends of ones of the columnar conductors; and joining the contact sites of the electronic substrate and corresponding ones of the second ends of the ones of the columnar conductors with the one of the solder and the electrically-conductive adhesive.

37. The method of claim 31 wherein the columnar conductors include at least a section that is solid metal and have an aspect ratio of at least 1.5.

38. The method of claim 31 wherein said providing an electronic component having contacts thereon includes providing at least one of an electronic device having contacts thereon, and/or a semiconductor wafer including a plurality of electronic circuits thereon each having contacts thereon.

39. The method of claim 38 further comprising separating the semiconductor wafer into individual semiconductor die each including at least one of the electronic circuits and having the corresponding ones of the columnar conductors connected thereto.

40. A method for making an electronic device comprising:
providing a sheet of metal;
providing a semiconductor wafer including a plurality of electronic circuits thereon each having a pattern of contacts;
removing part of the sheet of metal to leave a plurality of columnar conductors having distal ends projecting from a remaining web of the sheet of metal, the plurality of columnar conductors being in patterns corresponding to the patterns of contacts of the semiconductor wafer;
applying a layer of dielectric adhesive on the remaining web and surrounding the columnar conductors except for the distal ends thereof;
removing at least part of the remaining web to electrically isolate ones of the columnar conductors from others of the columnar conductors;
connecting the contacts of the semiconductor wafer to respective first ends of ones of the columnar conductors of the interposer, whereby the columnar conductors are connected to the semiconductor wafer; and
separating the semiconductor wafer and interposer connected thereto into individual semiconductor die each including at least one of the electronic circuits and having the corresponding ones of the columnar conductors connected thereto.

41. The method of claim 40 wherein said connecting the contacts includes:
applying one of solder and electrically-conductive adhesive to one of the contacts of the semiconductor wafer and first ends of ones of the columnar conductors; and
joining the contacts of the semiconductor wafer and corresponding ones of the first ends of the ones of the columnar conductors with the one of the solder and the electrically-conductive adhesive.

42. The method of claim 41 wherein said applying one of solder and electrically-conductive adhesive includes applying a pressure-sensitive electrically-conductive thermosetting adhesive that cures at a temperature of less than about 60° C.

43. The method of claim 42 wherein the pressure-sensitive electrically-conductive thermosetting adhesive has an immediate bond strength of at least about 100 psi and has a cured bond strength of at least about 1000 psi.

44. The method of claim 40 further comprising:
providing an electronic substrate having contact sites thereon; and
connecting the contact sites of the electronic substrate to respective second ends of the columnar conductors connected to the semiconductor die.

45. The method of claim 44 wherein said connecting the contact sites includes:
applying one of solder and electrically-conductive adhesive to one of the contact sites of the electronic substrate and the second ends of the columnar conductors; and
joining the contact sites of the electronic substrate and corresponding second ends of the columnar conductors with the one of the solder and the electrically-conductive adhesive.

46. The method of claim 40 wherein the columnar conductors include at least a section that is solid metal and have an aspect ratio of at least 1.5.

47. A method for making an interposer comprising:
providing a sheet of metal;
bonding a plurality of wires to the sheet of metal to provide a plurality of columnar conductors having first ends at the sheet of metal and distal ends projecting from the sheet of metal;
applying a layer of dielectric adhesive on the sheet of metal and surrounding the columnar conductors except for the distal ends thereof;
removing at least part of the sheet of metal to electrically isolate ones of the columnar conductors from others of the columnar conductors.

48. The method of claim 47 further comprising advancing the sheet of metal in the work space of a wire bonder for said bonding of a plurality of wires to the sheet of metal.

49. The method of claim 47 wherein said removing at least part of the sheet of metal comprises one of removing a first part of the sheet of metal to leave a plurality of first columnar conductors having distal ends projecting from the first ends of the columnar conductors, and removing the sheet of metal to expose the first ends of the columnar conductors.

50. The method of claim 47 wherein the columnar conductors include at least a section that is solid metal and have an aspect ratio of at least 1.5.

51. The method of claim 47 further comprising:
providing at least one of an electronic device having contacts thereon, an electronic component having contacts thereon, and/or a semiconductor wafer including a plurality of electronic circuits thereon each having contacts thereon; and
connecting the contacts to respective first ends of the columnar conductors.

52. The method of claim 51 further comprising separating the semiconductor wafer into individual semiconductor die each including at least one of the electronic circuits and having the corresponding ones of the columnar conductors connected thereto.

* * * * *